United States Patent [19]

Ishido

[11] 4,206,402
[45] Jun. 3, 1980

[54] SYSTEM AND METHOD FOR DETECTING LEAKAGE IN A PIPELINE OR TANK

[76] Inventor: Yasuhiro Ishido, Sayama, Japan

[21] Appl. No.: 905,222

[22] Filed: May 12, 1978

[30] Foreign Application Priority Data

Jun. 2, 1977 [JP] Japan .................................. 52-63961

[51] Int. Cl.² ...................... G01R 27/26; G01M 3/18; G08B 21/00
[52] U.S. Cl. ............................... 324/61 R; 73/40.5 R; 340/605
[58] Field of Search ...................... 324/61 R, 52, 60 C; 340/603, 604, 605; 73/40.5 R

[56] References Cited

U.S. PATENT DOCUMENTS

| | | | |
|---|---|---|---|
| 3,564,526 | 2/1971 | Butts | 340/605 X |
| 3,800,219 | 3/1974 | Fosberg | 340/604 X |
| 4,029,889 | 6/1977 | Mizuochi | 340/605 X |
| 4,041,771 | 8/1977 | Allan et al. | 340/605 X |
| 4,043,180 | 8/1977 | Morris et al. | 340/605 X |
| 4,095,174 | 6/1978 | Ishido | 324/61 R X |
| 4,112,355 | 9/1978 | Gibson, Jr. et al. | 324/61 R X |

Primary Examiner—Rudolph V. Rolinec
Assistant Examiner—Ernest F. Karlsen
Attorney, Agent, or Firm—George B. Oujcvolk

[57] ABSTRACT

A system for detecting fluid-leak in a pipeline or tank is disclosed, which includes a sensing coaxial cable having an outer conductor divided into a plurality of sections and a continuous inner conductor, the coaxial cable being permeable to oily fluids so that the distributed capacity of the coaxial cable can be changed upon penetration by the fluids. Whether or not the change has occurred may be detected by supplying an oscillator signal to each section of the outer conductor to measure an output from the inner conductor at a low frequency signal operational amplifier.

1 Claim, 10 Drawing Figures

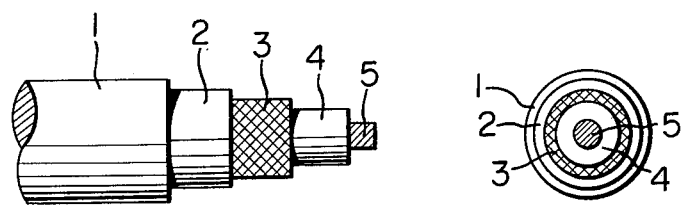
FIG. 1
FIG. 2
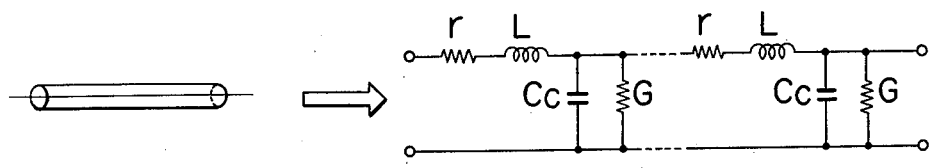
FIG. 3
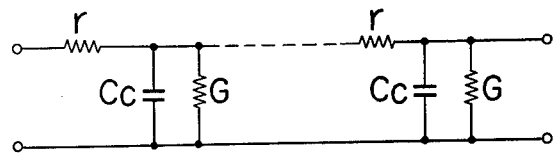
FIG. 4
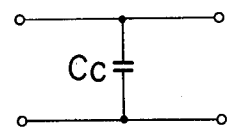
FIG. 5
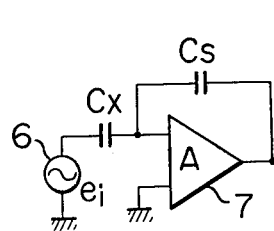
FIG. 6
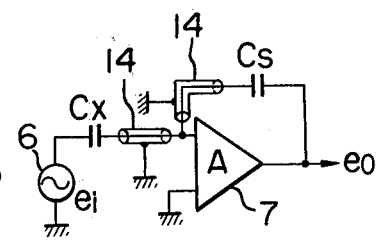
FIG. 7
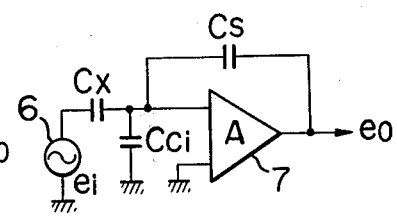
FIG. 8
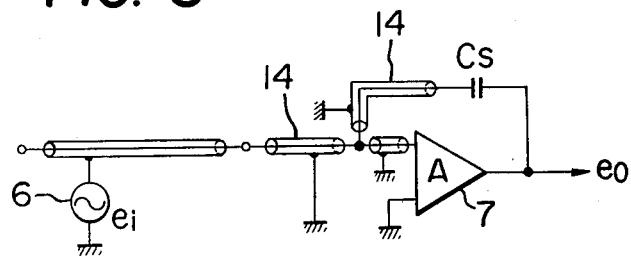

SYSTEM AND METHOD FOR DETECTING LEAKAGE IN A PIPELINE OR TANK

BACKGROUND OF THE INVENTION

1. Field of the Invention:

This invention relates to a system and a method for detecting leakage in a pipeline for conveyance of petroleum crudes or products or in a fuel tank therefor by means of a change in the dielectric constant (distributed capacity) of a sensing coaxial cable buried adjacent to the pipeline or the tank due to penetration by the oily fluid leaking therefrom.

2. Description of the Prior Art:

It becomes now extremely important to promptly detect any leak from pipelines or big storage tanks for petroleum crudes or products. Heretofore, there have been proposed a variety of detection methods, including a flow rate difference system, a pressure wave system, a supersonic system, an insulating resistance deterioration detecting system, a pulse reflection system, etc. However, any of these methods is not satisfactory with respect to detection accuracy, cost and operation.

SUMMARY OF THE INVENTION

The present invention has proposed in U.S. Pat. No. 4,095,174 issued June 13, 1978, by the present inventor, a system for detecting leakage in a pipeline, which includes a sensing elongated coaxial cable with inner and outer conductors, said coaxial cable being divided into a plurality of separate sections of substantially equal electrical characteristics and buried adjacent to the pipeline wherein there is a variation in the distributed capacity of the inner and outer conductors upon penetration by an oily substance, said variation serving to sense leakage of oily substance from the pipeline;

an input cable and an oscillator cable both arranged electrically in parallel with the coaxial cable, switching circuits connected to each of said sections, said switching circuits being adapted to, when actuated, connect the input and oscillator cables to the inner and outer conductors, respectively, of each of the sections of the coaxial cable;

an oscillator connected to the oscillator cable;

an input measuring circuit connected to the input cable; and, scanning means electrically coupled to the switching circuits for scanning the switching circuits for the actuation thereof and causing all the sections of the coaxial cable to be scanned in sequence, thereby measuring the distributed capacity of each of the sections of the coaxial cable by means of a signal from the oscillator.

The principle of the detecting system using the sensing coaxial cable will be described with reference to FIGS. 1 through 9.

Referring to FIG. 1, the sensing coaxial cable is generally composed of an inner conductor 5, a first insulated tubular layer 4 surrounding the conductor 5, an outer conductor 3 surrounding the insulated layer 4, a second insulated layer 2 surrounding the second conductor 3, and a protecting layer 1 surrounding the second insulated layer 2.

These first and second insulators are made of a specific substance which prevents water from penetrating therethrough but permits the penetration of an oily fluid such as a petroleum crude or product. A specific porous polytetrafluoroethylene resin commercially available as a trade name of "Gore-Tex" is suitably employed as the insulator.

As a consequence of the above design, when the sensing cable is exposed in a moistened condition, the dielectric constant between the inner and outer conductors 3 and 5 does not change. However, when penetrated by an oily substance, the dielectric constant can change proportionally to the degree of the penetration.

In FIG. 2, which shows an equivalent circuit of the sensing cable of a unit length, L indicates an inductance per unit length, r a loss resistance, G conductance and $C_c$ indicates distributed capacity.

With a low frequency, the circuit of FIG. 2 may be shown as indicated in FIG. 3. In general, since the loss resistance r is negligibly small in case of low frequency computations and the conductance G is able negligible in measurements of a minute voltage of several volts, an equivalent circuit of the sensing cable may be as illustrated in FIG. 4 having only the distributed capacity $C_c$.

Thus, by detecting the change of this distributed capacity, it is possible to determine the penetration at the sensing cable by the leaked oil.

A method for the measurement of the distributed capacity by means of an operational amplifier is shown in FIG. 5, in which an oscillator is indicated as 6 and an operational amplifier as 7. Now, when the oscillation output of the oscillator 6 is represented by $e_i$, the capacitance of a sample by $C_x$, the feedback capacity by $C_s$, and the open loop gain of the operational amplifier by A, then the output $e_o$ may be given as:

$$e_o = C_x/C_s \cdot \frac{e_o}{1 + \frac{1}{A}(1 + C_x/C_s)} \quad (1)$$

Since the gain A of a general operational amplifier has a value of $10^3$ to $10^6$, the output $e_o$ may be shown as:

$$e_o = C_x/C_s \cdot e_i \quad (2)$$

FIG. 6 shows the measurement at a remote position of the distributed capacity using a cable 14 for the input side. The equivalent circuit for this case using the input cable 14 may be, at a low frequency, as illustrated in FIG. 7, in which $C_{ci}$ represents the distributed capacity of the cable 14. Thus, the output is given by the following equation.

$$e_o = C_x/C_s \cdot \frac{e_i}{1 + \frac{1}{A}(1 + C_x/C_s + C_{ci}/C_s)} \quad (3)$$

It will be seen from the above equation that, in the remote measurement, the distributed capacity $C_{ci}$ of the input cable 14 has an influence on the measurement of the output $e_o$, because the longer the input cable 14, the larger becomes the $C_{ci}/C_s$ value. However, when the open loop gain A of the amplifier 7 is sufficiently high, the term $1/A \cdot (1 + C_x/C_s + C_{ci}/C_s)$ of the equation (3) may be neglected, so that the output $e_o$ may be shown:

$$e_o = C_x/C_s \cdot e_i \quad (4)$$

Thus, the $C_{ci}/C_s$ value may give no influence on the measurement.

From the equation (4), it will be appreciated that the guard ring effect may be obtained even when the input cable 14 has a considerable length, so that the results of the measurement at a remote point is almost comparable to those obtained by the measurement at input points.

Further, when a sensing cable, in place of the capacitance $C_x$ of the sample, is subjected to the measurement as shown in FIG. 8, its equivalent circuit may be shown as FIG. 9. When the distributed capacity of the sensing cable is indicated as $C_{cx}$ the output $e_o$ may be shown:

$$e_o = C_{cx}/C_s e_i \quad (5)$$

As the above equations indicate, this system has the following advantages:

1. Since the result by this method is independent of the measuring frequency, it becomes possible to adopt a low frequency for the measurement. The use of a low frequency contributes to a reduction in transmission losses, etc. which are inevitable in the pulse reflection method.

2. Even when the input cable 14 has a considerable length, measurements at remote points may be carried out with high precision, since the guard ring effect imparted to the input cable 14 effectively reduces the errors in distributed capacity and at the same time shields the cable against external noise.

While the system of the former application shows satisfactory leakage detecting performance with extremely high accuracy, the sensing cable is divided into a plurality of sections each including divided inner and outer conductors, and each of said divided inner and outer conductors being connected to the input and oscillator cables, respectively, by switching circuits. For this reason, a need arises to simplify wiring of each cable and switching circuit so as to reduce the cost and save the work for laying the cables.

Upon repeated trial and errors to satisfy such need, it has been found that the distributed capacity is able to be precisely measured by means of a sensing coaxial cable having an inner and outer conductors, in which only the outer conductor is divided into a plurality of sections. That is, since a low frequency measurement is available, when a low frequency signal is applied to one of the divided sections of the outer conductor to detect the output signal from the continuous inner conductor, the inner conductor adjacent to the other sections of the outer conductor becomes as if they were provided with guard rings, so that no damping of the low frequency signal is caused.

The present invention provides a system for detecting leakage of an oily fluid in a pipeline or tank, which includes an elongated sensing coaxial cable buried adjacent to the pipeline or tank, said coaxial cable having an inner and an outer conductors and being permeable to the oily fluid, the distributed capacity between the inner and outer conductors being changed upon penetration by the oily fluid, said outer conductor being divided into a plurality of separate sections;

an oscillator generating an oscillator signal;

switching circuits disposed between each one of said sections and said oscillator, such that the oscillator signal is supplied to said sections by the actuation of the switching circuits, said sections are normally grounded when the switching circuits are not actuated;

means, electrically coupled to said switching circuits, for actuating said switching circuits in sequence; and means, connected to said inner conductor by an input cable, for measuring an output from said inner conductor thereby detecting the change in the distributed capacity of said coaxial cable in each section.

According to the present invention, there has been further provided a method for detecting leakage in a pipeline or tank using the above system.

It is, accordingly, an object of the present invention to provide a system which allows the accurate detection of leakage with the use of a sensing coaxial cable, wherein no damping of applied low frequency signals occurs.

Another object of the invention is to provide a fluid-leak detecting system having simplified wiring of cables and switching circuits.

A further object of the invention is to provide a method which permits the accurate measurement of the distributed capacity and the precise determination of the location at which leakage occurs, with the use of low frequency signals.

A further object of the invention is to provide a system for the detection of leakage wherein replacement of the portion of the sensing cable, at which penetration by the leaked fluid has occurred, with a new sensing cable may be easily conducted.

It is a special object of the present invention to provide a method which permits the prompt, accurate leakage detection by centralized monitor.

BRIEF DESCRIPTION OF THE DRAWINGS

Other objects, features and advantages of this invention will become apparent from the detailed description of the preferred embodiment which follows, when considered in light of the accompanying drawings, in which FIG. 1 is a fragmentary view showning a sensing coaxial cable used in the system of this invention;

FIGS. 2 through 4 are schematic views illustrating equivalent circuits of the sensing cable;

FIG. 5 is a view of the principle of a method for measuring distributed capacity using an operational amplifier;

FIGS. 6 through 8 an explanatory view schematically illustrating a system for measuring distributed capacity using an input cable;

DESCRIPTION OF THE PREFERRED
EMBODIMENTS OF THE INVENTION

Figure 9:
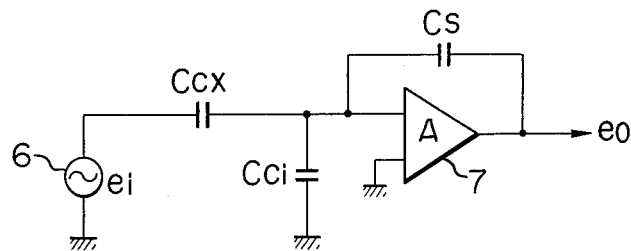
FIG. 9 is a view schematically showing an equivalent circuit of the circuit of FIG. 8.
Figure 10:
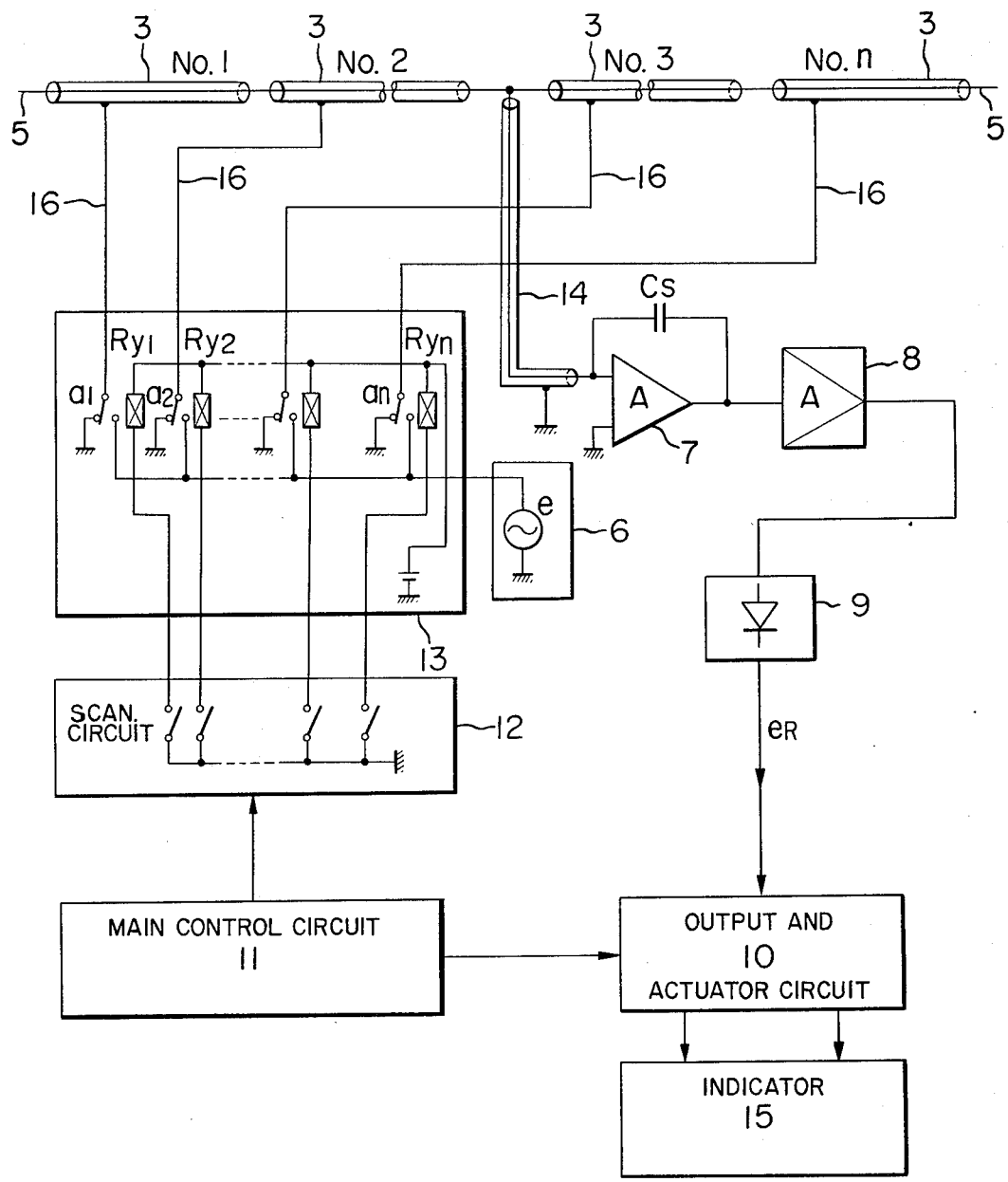
FIG. 10 is a block diagram illustrating an embodiment of the present invention.

Referring now to FIG. 10, a sensing cable which is, as mentioned previously, permeable only to an oily fluid to cause a change in its dielectric constant (distributed capacity), is divided such that only its outer conductor 3 is divided into sections $No_1$ to $No_n$ while its inner conductor 5 is continuous. However, it is preferred that the inner conductor be divided into the same number of the sections as the outer conductor and each neighbouring sections of the inner conductor be again electrically connected in series by any suitable means such as connectors so as to facilitate possible replacement work of the coaxial cable, which might be necessitated when the penetration by the leaked fluid has occurred.

Each of the sections of the outer conductor 3 of the sensing cable is connected to each one of contact elements $a_1$ through $a_n$ of switching circuits generally indicated as 13, preferably relay circuits $Ry_1$ through $Ry_n$, via oscillator cable 16, 16, . . . Thus, by the actuation of the relays $Ry_1$ to $Ry_n$, an oscillation signal e generated at an oscillator 6 is supplied to the oscillator cables 16, 16 . . .

The relays $Ry_1$ to $Ry_n$ are operated in sequence by the sequential operation of a scanning circuit 12 controlled by a main control circuit 11, so that the oscillation signal is supplied to only one of the sections $No_1$ to $No_n$ at one time.

An input cable 14 is, at one end, connected to any suitable portion of the continuous inner conductor 5 of the sensing coaxial cable and, at the other end, to an input measuring circuit 7 composed of an operational amplifier.

The signal introduced through the input cable 14 into the input measuring circuit 7 is transferred to an output circuit 10 via amplifier 8 and synchronous rectifier 9.

In the output circuit 10, a predetermined level value is set, and when a DC output $e_R$ is given from the synchronous rectifier 9 to the output circuit 10, the value is compared with the level value at the circuit 10. The circuit 10 is so arranged that, when the value $e_R$ exceeds the level value, it acts on an indicator circuit 15 to generate a warning signal.

The above described system is operated as follows.

First, the main control circuit 11 is operated to have the scanning circuit 12 actuate the switching circuits so that the relays $Ry_1$ to $Ry_n$ are scanned, in sequence. By this, the oscillation signal e from the oscillation circuit 6 is supplied through contacts $a_1$ through $a_n$ to the divided sections of the outer conductor of the sensing coaxial cable, in sequence.

The distributed capacity of each of the sections $No_1$ to $No_2$ is thus detected at the input measuring circuit 7. Since only one of the relays is operated at one time by the action of the scanning circuit to supply the oscillation signal to the corresponding one of the sections of the outer conductor and since, in this case, the other sections of the outer conductor are grounded via contacts $a_1$ through $a_n$, the inner conductor is in a guard ring-condition, so that the oscillation signal e may be accurately measured without receiving any external noise.

The distributed capacity detected at the input measuring circuit 7 is amplified, as mentioned above, by the amplifier 8, and is converted into a DC output $e_R$ by the synchronous rectifier 9, which is then compared with the predetermined level value at the output circuit 10.

When leakage occurs at a pipeline or tank (not shown) and the leaked oily fluid penetrates the sensing coaxial cable to change the distributed capacity thereof, the output from the output circuit 10 actuates the indicator circuit 15 to generate a warning signal. Thus, the section of the sensing cable at which the penetration by the leaked fluid has occurred may be determined by determining which relay is being actuated when the indicator circuit generates the warning. By supplying an output signal from the main control circuit 11 to the output circuit 10, the location of the fluid-leak may be indicated at the indicator circuit 15, for example visually using a series of indicator lamps.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A system for detecting leakage for an oily fluid in a pipeline or tank, comprising:
    (a) a sensing coaxial cable buried adjacent to the pipeline or tank, said coaxial cable including an inner and an outer conductor and being permeable to an oily fluid, the distributed capacity between the inner and outer conductors being changed upon penetration by an oily fluid, said outer conductor being divided into a plurality of separate sections;
    (b) an oscillator for generating an oscillator signal, disposed for coupling to each of said separate sections;
    (c) switching circuits, including a plurality of relays corresponding in number to the sections of said outer conductor each being interposed between one of said sections and said oscillator for coupling said oscillator to each of said separate sections so that the oscillator signal is supplied to said sections by the actuation of the switching circuits and said sections are normally grounded when the switching circuits are not actuated;
    (d) actuating means including scanner means electrically coupled to said switching circuits for actuating said switching circuits in sequence and scanning said switching circuits in sequence thereby causing the coaxial cable in each section to be scanned in sequence; and,
    (e) measuring means including a low frequency signal operational amplifier connected to said inner conductor by an input cable for measuring an output from said inner conductor thereby determining whether or not the change in the distributed capacity of each section of said coaxial cable has occured which would signify penetration by an oily fluid.

* * * * *